United States Patent
Maekawa et al.

[11] Patent Number: 5,950,078
[45] Date of Patent: Sep. 7, 1999

[54] RAPID THERMAL ANNEALING WITH ABSORPTIVE LAYERS FOR THIN FILM TRANSISTORS ON TRANSPARENT SUBSTRATES

[75] Inventors: Masashi Maekawa; Jer-shen Maa, both of Vancouver, Wash.

[73] Assignees: Sharp Laboratories of America, Inc., Camas, Wash.; Sharp Kabushiki Kaisha, Osaka, Japan

[21] Appl. No.: 08/934,347

[22] Filed: Sep. 19, 1997

[51] Int. Cl.$^6$ .............................. H01L 21/00; H01L 21/76
[52] U.S. Cl. ........................ 438/149; 438/161; 438/447
[58] Field of Search ................................... 438/149, 161, 438/162, 447, 448, 450, 704, 969

[56] References Cited

U.S. PATENT DOCUMENTS

| | | | |
|---|---|---|---|
| 5,302,230 | 4/1994 | Ino et al. | 156/603 |
| 5,403,772 | 4/1995 | Zhang et al. | 437/101 |
| 5,488,000 | 1/1996 | Zhang et al. | 437/21 |
| 5,529,937 | 6/1996 | Zhang et al. | 437/10 |
| 5,578,520 | 11/1996 | Zhang et al. | 437/81 |
| 5,604,360 | 2/1997 | Zhang et al. | 257/72 |
| 5,608,232 | 3/1997 | Yamazki et al. | 257/66 |
| 5,639,698 | 6/1997 | Yamazaki et al. | 437/228 |
| 5,861,337 | 1/1999 | Zhang et al. | 438/447 |

OTHER PUBLICATIONS

Article entitled, "Reflectivity Reduction by Oxygen Plasma Treatment of Capped Metallization Layer" authored by J.–S. Maa, D. Meyerhofer, J.J. O'Neill, Jr., L. White, and P.J. Zanzucchi, published in the J. Vac. Sci. Technol., B7(2), Mar./Apr. 1989, pp. 145–149.

*Primary Examiner*—Richard Booth
*Assistant Examiner*—Michael S. Lebentritt
*Attorney, Agent, or Firm*—Gerald Maliszewski; David C. Ripma

[57] ABSTRACT

A method for rapid thermally annealing a thin amorphous film on a transparent substrate with the use of a radiation absorption film is provided. Unlike a transmissive silicon thin film, or transparent substrate, the metal absorptive film has excellent radiation absorption characteristics. When a radiation absorption layer is added to the substrate it is possible to rapidly anneal an amorphous silicon film with convention IC process radiation lamps. The metal absorption film also acts to conduct the heat to the amorphous silicon. The control provided by the choice of metal material, metal thickness, the oxidation of the metal surface, and the heat and duration of the RTA process provide unique opportunities to control the crystallization process. Polysilicon made by the above-described method has the potential of high electron mobility and low production costs. A thin-film structure for use in a TFT, made through the above-described method, is also provided.

32 Claims, 5 Drawing Sheets

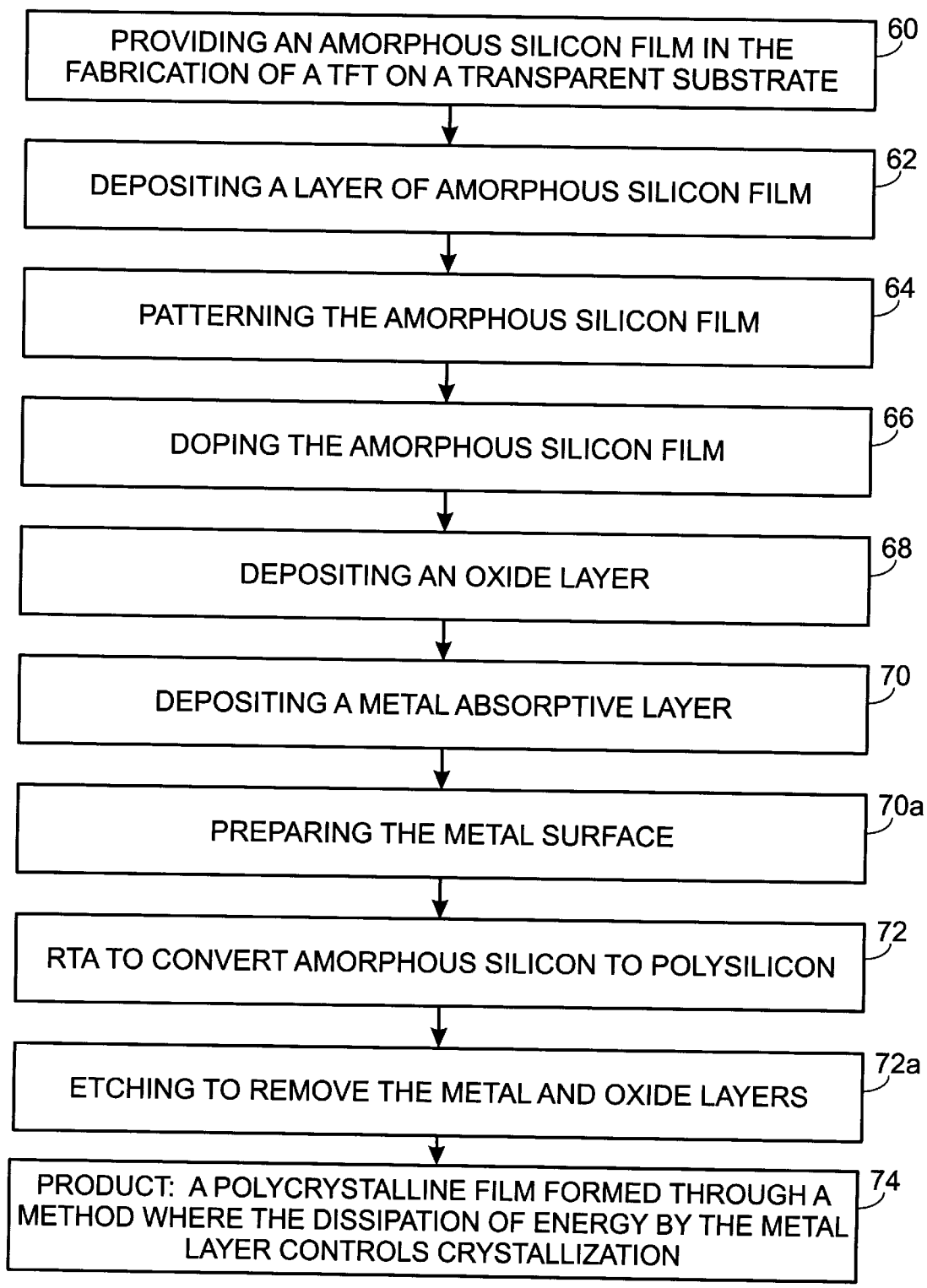

RAPID THERMAL ANNEALING WITH ABSORPTIVE LAYERS FOR THIN FILM TRANSISTORS ON TRANSPARENT SUBSTRATES

BACKGROUND AND SUMMARY OF THE INVENTION

This invention relates generally to thin-film transistor (TFT) processes and fabrication and, more particularly, to a TFT polycrystalline film, and method of rapid thermal annealing (RTA) a film of amorphous silicon with the use of a metal absorptive film to absorb radiated energy, conduct heat, and so encourage the crystallization of the silicon film.

The demand for smaller electronic consumer products with higher resolution displays, and larger displays made without degradation of resolution, spurs continued research and development in the area of liquid crystal displays (LCDs). The size of LCDs can be decreased by incorporating the large scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin-film transistor (TFT). TFTs are typically fabricated on a transparent substrate such as quartz, glass, or even plastic. TFTs are almost exclusively used as switches to allow the various pixels of the LCD to be charged in response to the driver circuits. TFT performance will be improved, and driver circuit functions incorporated into TFTs, by increasing the electron mobility in the TFT devices. Increasing the electron mobility of a transistor results in a transistor having faster switching speeds. Improved TFTs having increased electron mobility yield smaller, higher resolution, LCD screens, with lower power consumption and faster transistor response times. Further LCD resolution enhancements will require that the TFTs mounted on the transparent substrates have electron mobility characteristics rivaling IC driver circuits currently mounted along the edges of the screen. That is, display and driver TFT located across the entire display must operate at substantially the same level of performance.

The carrier mobility of typical thin-film transistors, with active areas formed from amorphous film, is poor, on the order of 0.1 to 0.2 $cm^2/V \cdot s$. Carrier mobility is improved by using crystallized silicon. Single crystal silicon transistors, which are usually used in TFT driver circuits, have electron mobilities on the order of 500 to 700 $cm^2/V \cdot s$. Polycrystalline silicon transistor performance is between the two extremes, having mobilities on the order of 10 to 400 $cm^2/V \cdot s$. Thin-film transistors having mobilities greater than 100 $cm^2/V \cdot s$ would probably be useful in replacing LCD periphery mounted driver circuitry. However, it has been difficult to produce polycrystalline TFTs with electron mobilities of even 40 to 50 $cm^2/V \cdot s$.

Single crystal silicon films, for use with LCDs, are difficult to fabricate when adhered to relatively fragile transparent substrates. A quartz substrate is able to withstand high process temperatures, but it is expensive. Glass is inexpensive, but is easily deformed when exposed to temperatures above 600° C. for substantial lengths of time. Even the fabrication of polycrystalline silicon transistors has been very difficult due to the necessity of using low temperature crystalline processes when glass is involved. Current polycrystalization processes typically require annealing times of approximately 24 hours, at 600° C., to produce TFTs having a mobility of approximately 30–50 $cm^2/V \cdot s$. These processes are not especially cost effective due to the long process times, and the TFTs produces are not suitable for LCD driver circuits.

The direct deposition of amorphous silicon film is probably the cheapest method of fabricating TFTs. Typically, the transparent substrate is mounted on a heated susceptor. The transparent substrate is exposed to gases which include elements of silicon and hydrogen. The gases decompose to leave solid phased silicon on the substrate. In a plasma-enhanced chemical vapor deposition (PECVD) system, the decomposition of source gases is assisted with the use of radio frequency (RF) energy. A low-pressure (LPCVD), or ultra-high vacuum (UHV-CVD), system pyrolytically decomposes the source gases at low pressures. In a photo-CVD system the decomposition of source gases is assisted with photon energy. In a high-density plasma CVD system high-density plasma sources, such as inductively coupled plasma and helicon sources, are used. In a hot wire CVD system the production of activated hydrogen atoms may lead to the decomposition of the source gases. However, TFTs made from direct deposition have poor performance characteristics, with mobilities on the order of 1 to 10 $cm^2/V \cdot s$.

Various annealing methods exist for turning amorphous silicon into polycrystalline silicon. Solid phase crystallization (SPC) is a popular method of crystallizing silicon. In this process, amorphous silicon is exposed to heat approaching 600° C. for a period of at least several hours. Typically, large batches of LCD substrates are processed in a furnace having a resistive heater source. TFTs made from this crystallization process are more expensive than those made from direct deposition, but have mobilities on the order of 50 $cm^2/V \cdot s$.

A rapid thermal anneal (RTA) uses a higher temperature but for very short durations of time. Typically, the substrate is subjected to temperatures approaching 700 or 800° C. during the RTA, however, the annealing process occurs relatively quickly, in minutes or seconds. Glass substrates remain unharmed due to the short exposure time. Because the process is so rapid, it is economical to process the substrates serially. Single substrates can also be brought up to annealing temperatures faster than large batches of substrates. A tungsten-halogen, or Xe Arc, heat lamp is often used as the RTA heat source.

An excimer laser crystallization (ELC) process has also been used with some success in annealing amorphous silicon. The laser allows areas of the amorphous film to be exposed to very high temperatures for very short periods of time. Theoretically, this offers the possibility of annealing the amorphous silicon at its optimum temperature without degrading the transparent substrate upon which it is mounted. However, use of this method has been limited by the lack of control over some of the process steps. Typically, the aperture size of the laser is relatively small. The aperture size, power of the laser, and the thickness of the film may require multiple laser passes, or shots, to finally anneal the silicon. Since it is difficult to precisely control the laser, the multiple shots introduce non-uniformities into the annealing process. Further, the wafers must be annealed serially, instead of in a furnace in batches. Although mobilities of over 100 $cm^2/V \cdot s$ are obtainable, TFTs made by this method are significantly more expensive than those made by direct deposition or SPC.

It is generally acknowledged that the RTA process of forming polycrystalline silicon would be very effective in fabricating TFT devices in the LCD industry. However, means must be developed to address the contradictory problems of exercising greater control over the temperature of the amorphous silicon films, and decreasing the annealing times. These problems are complicated by the fact that a silicon film must be relatively thick before it is able to absorb a significant percentage of energy radiated during annealment. Typically, TFTs are fabricated by deposited amorphous silicon over layers of oxide material and a transparent substrate. Of these three materials, only the amorphous silicon is able to absorb a significant percentage of light energy. However, as the thickness of the amorphous silicon layers decrease, to improve transistor parameters such as switching speed, the silicon becomes unable to absorb enough light to rapidly anneal. Currently, the TFT industry is attempting to fabricate transistors with active areas as thin as 300 Å. At such a thickness amorphous silicon is mostly transmissive of the light wavelengths typically used for annealment.

Several solutions have been attempted to address the problem of directing additional heat to the thin silicon layers. One solution is to form a thick amorphous silicon film, with an intervening oxide or nitride barrier layer, over the thin silicon film to be crystallized. This method allows enough heat to be absorbed to support RTA, but the additional process steps are burdensome in the cost conscious environment of TFT fabrication. The thick silicon absorption and barrier layers must be removed in a dry etch process, such as plasma etching. This method of etching adds a major process step to in the annealing of silicon.

A further problem in the use of thick silicon layers is the potential of cracks occurring in these layers during the annealment process. As a result of the cracking, the delivery of heat to the intended thin layer of amorphous silicon is non-homogenous. That is, the non-uniform delivery of heat results in poor crystallization, with poor electron mobility. Further, the irregular, cracked pattern in the silicon surface can be transferred to the intended silicon film during etching.

Specific wavelengths of light have been used to encourage the absorption of light in thin films of silicon. Silicon has a higher absorption coefficient at shorter wavelengths of visible light. The tungsten-halogen lamp, generally used in the industry for RTA processes, has a lower intensity at these short wavelengths. In typical IC processes, where relatively thick wafers are used, the tungsten-halogen is sufficient to rapidly heat the substrates in fabrication. A Xe arc lamp has a greater intensity at the shorter wavelengths absorbed by thin films of silicon. However, these lamps are more expensive, and less robust, so that their use adds costs and complications to high volume annealment processes. As evidence of this statement, it is estimated that approximately 90% of the lamps used for annealing in the industry are tungsten-halogen.

Ino and Tani, U.S. Pat. No. 5,302,230, disclose the use of a support plate to encourage the crystallization of silicon. However, the use of a support plate adds complications to a commercial IC process, and the temperatures disclosed in the patent would likely deform glass substrates such as Corning 1737, which is susceptible to damage at temperatures above approximately 600° C.

It would be advantageous if a method were found of rapidly thermally annealing amorphous silicon to form polycrystalline TFT transistors on glass substrates with electron mobilities exceeding 100 cm$^2$/V·s.

It would be advantageous if a method were found for increasing the amount of radiated energy absorbed by the thin film silicon substrate, to fabricate a high quality polycrystalline film suitable for TFTs with high electron mobility and low leakage currents.

It would be advantageous if a method were found to increase to conduction of heat to thin films of amorphous silicon when absorptive layers are used to aid the RTA process.

It would be advantageous if a method were found to decrease the amount of time needed to rapid thermal anneal a thin film of amorphous silicon on a transparent substrate.

It would be advantageous if a method were developed to use the conventional tungsten-halogen heat lamp, or any available heat lamp, to RTA a thin film of amorphous silicon.

Accordingly, a method for crystallizing a thin amorphous film, such as in the fabrication of a TFT, has been provided comprising the steps of:

a) depositing a layer of the amorphous film having a first thickness;

b) depositing a layer of metal absorptive film, having a second thickness, overlying the amorphous film layer, to absorb and conduct radiated energy; and c) rapid thermal annealing (RTA) to convert the amorphous film layer deposited in Step a) into a polycrystalline film layer, whereby the dissipation of heat through the metal absorptive film layer controls the crystallization process.

The amorphous film is selected from the group consisting of silicon, germanium, and silicon-germanium alloys, although the crystallization of silicon is generally preferred. The metal absorptive film is selected from the group consisting of Ti, Ta, W, TiN, Mo, Nb, V, and Ti—W, and has a thickness in the range between 250 and 5000 Å.

The rapid thermal annealing occurs at a temperature in the range between 600 and 800° C. for a period of time between 1 second and 5 minutes. Typically, the amorphous film is doped before the RTA. The dopant is either activated in a separate annealing process, or during RTA.

In some aspects of the invention a layer of oxide film is deposited over the amorphous film layer to act as a barrier between the amorphous film and the subsequently deposited metal absorptive film so that the amorphous film does not react with the metal absorptive film during the RTA.

In a preferred embodiment of the invention, the surface of the metal absorptive film layer is prepared, in a separate process step, to be highly absorptive of radiated energy. The surface of the metal absorptive film layer is prepared by oxidation and anodization, either of which forms an oxide layer over the metal film, or by nitridation, to form a nitride layer over the metal film. In this manner, over 50% of the radiated light, over a spectrum of wavelengths between 200 nanometers and 1 micron, is absorbed by the metal absorptive film. The amorphous film is patterned to form isolated regions either before, or after the RTA process.

A thin-film structure for use in a thin-film transistor (TFT) of an LCD, made in accordance with the above-described method, is also provided. The substrate comprises a transparent substrate and a polycrystalline silicon film overlying the transparent substrate. The polycrystalhine silicon film is formed by rapid thermal annealing (RTA) an amorphous silicon film, having a first thickness, with a metal absorptive film layer, having a second thickness, temporarily overlying the amorphous silicon film. The temporary metal absorptive film layer is deposited to absorb and conduct radiated energy to said amorphous silicon film, controlling the crystallization process. The temporary metal absorptive film is removed in subsequent process steps. In this manner, thin layers of amorphous silicon are heated sufficiently to rapid thermal anneal said amorphous silicon film with a heat lamp.

BRIEF DESCRIPTION OF THE DRAWING

FIG. 11 is a flow chart illustrating steps in a method for crystallizing a thin layer of amorphous silicon film in the fabrication of a thin-film transistor on a transparent substrate.

DETAIL DESCRIPTION OF THE PREFERRED EMBODIMENT

Figure 1:
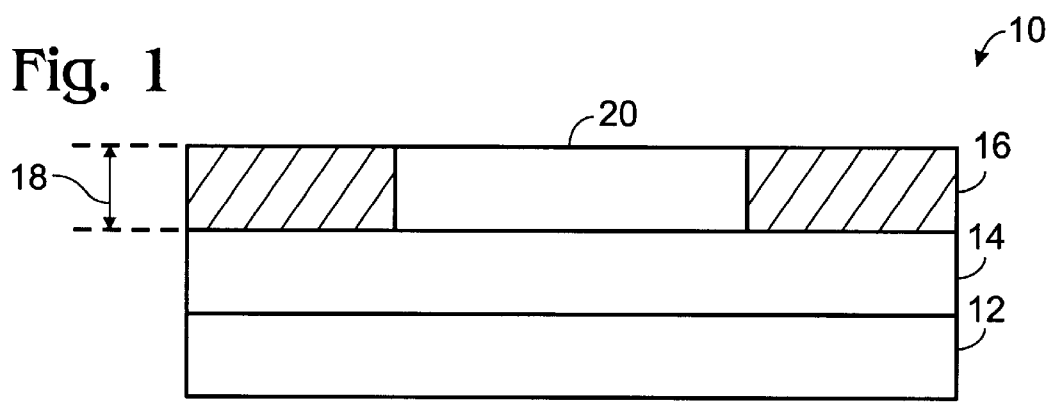
FIGS. 1 through 9 illustrate steps in fabricating a thin-film structure for use in a TFT of a liquid crystal display (LCD).

FIGS. 1 through 9 illustrate steps in fabricating a thin-film structure 10 for use in a TFT of an LCD. FIG. 1 depicts a transparent substrate 12 suitable for use as the screen of an LCD. Typically, transparent substrate 12 is glass. Transparent substrate 12 is alternately made from quartz, however, quartz is too expensive for use in competitively priced mass production units. In the preferred embodiment, a layer of oxide film 14 overlies transparent substrate 12 to prevent contamination of transparent substrate 12 from subsequently deposited IC materials, and IC process materials used to add, treat, or remove IC materials.

An amorphous silicon film 16, having a first thickness 18, overlies transparent substrate 12 and oxide film layer 14. As depicted in FIG. 6 and described below, a polycrystalline film (not shown) is formed by rapid thermal annealing (RTA) amorphous silicon film 16. Amorphous silicon film first thickness 18 is in the range between 300 and 1000 Å. The use of thin silicon film 16 for the fabrication of transistors active areas is essential to further reduce leakage currents and switching speeds. In some aspects of the invention amorphous silicon film 16 is patterned, doped, and annealed to activate the dopant before the subsequent deposition of the temporary metal absorptive film layer (see FIG. 3). In this manner, silicon film areas 20 of FIG. 1, subsequently forming transistor active regions, are isolated before the RTA crystallization process described below. The area of amorphous film 16 that is removed by the patterned is represented by hatched lines. The processes of patterning, doping, and annealing to activate the dopant are not unique to the present invention, and are well known in the art. For the purposes of simplicity and clarity, the areas of amorphous film 16 removed by patterning are not depicted in FIGS. 2–5.

Figure 2:
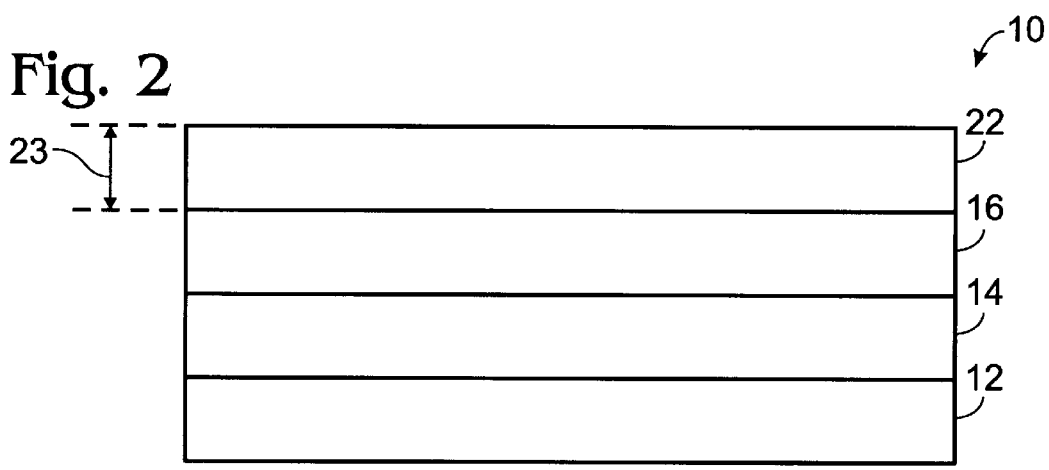

FIG. 2 depicts the deposition of a layer of oxide film 22, having a third thickness 23. Oxide film 22 is deposited between amorphous film layer 16 and a subsequently deposited metal absorptive film layer (see FIG. 4) to act as a barrier during the RTA process. When silicon film 16 is patterned as in FIG. 1, a portion of oxide layer 22 is deposited directly over portions of oxide layer 14. Oxide film layer 22 is removed in process steps following the RTA (see FIG. 6). Oxide film layer 22 prevents the subsequently deposited temporary metal absorptive film (not shown) from reacting with amorphous silicon film 16 during the RTA process. Oxide film third thickness 23 is in the range between 200 and 2000 Å.

Figure 3:
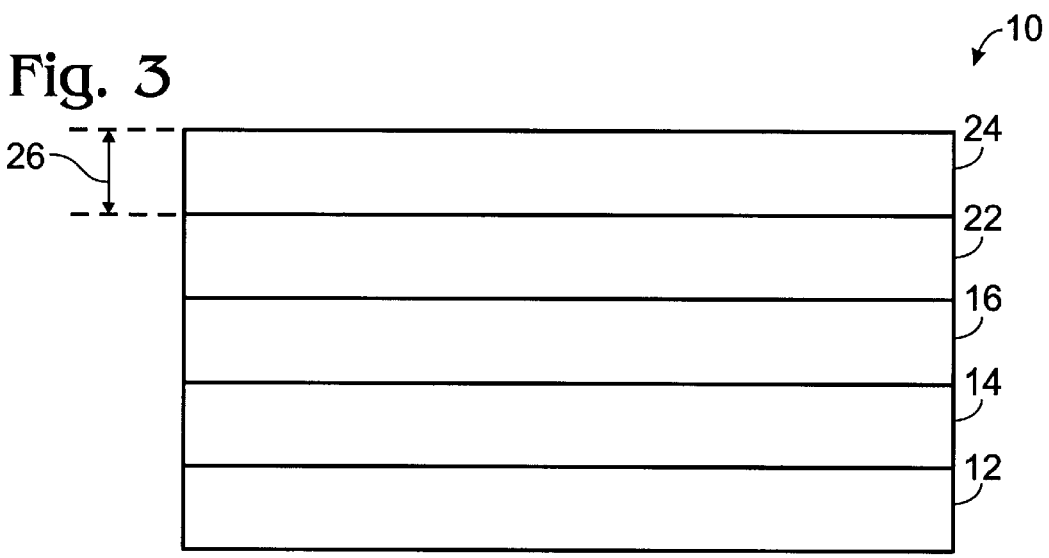

FIG. 3 depicts the deposition of a metal absorptive film layer 24, having a second thickness 26, temporarily overlying amorphous silicon film 16 and oxide film 22. Temporary metal absorptive film layer 24 is deposited to absorb and conduct radiated energy to amorphous silicon film 16, controlling the crystallization process. In this manner, thin layer of amorphous silicon 16 is heated sufficiently to rapid thermal anneal amorphous silicon film 16 with a heat lamp (not shown). Temporary metal absorptive film 24 is removed in subsequent process steps (see FIG. 6).

Metal absorptive film 24 is selected from the group consisting of Ti, Ta, W, TiN, Mo, Nb, V, and Ti—W. These metals are used because they are not as reflective as some metals typically used in IC processes such as aluminum. As described below, it is possible to treat these metals to become even more absorptive through additional processes. These refractory metals have a high melting point, relative to many other metals. Further, refractory metals exhibit good adhesion to oxide, so that they are unlikely to peal off during the process of annealing.

Temporary metal absorptive film second thickness 26 is in the range between 250 and 5000 Å. At a thickness below 350 Å, these metals do not become transmissive to light. Thin films of silicon do not absorb enough radiated energy to be rapidly annealed, however, thin of an absorptive film may be used to absorb radiated energy. In addition, the proximity of metal film 24 to amorphous silicon film 16 insures that the absorbed heat is conducted to amorphous silicon film.

Figure 4:
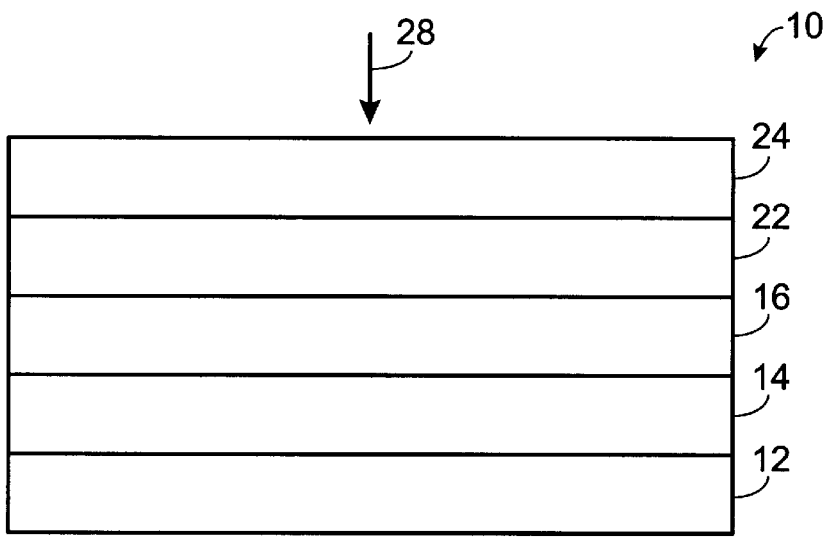

FIG. 4 depicts the surface of temporary metal absorptive film layer 24 being prepared to be highly absorptive of radiated energy. The absorption coefficient of the specific absorptive metals mentioned above is good, with the coefficients being specifically related to the wavelength of light used and the metal thickness. Typically, approximately 50% of light is absorbed using the wavelengths of convention radiation lamps, before the surface preparation treatment. However, it is possible to treat temporary metal absorptive film layer 24 to have an even higher absorption coefficient. In this manner, the amount of heat conducted to amorphous silicon film 16 is increased to speed the annealing process described below.

Temporary metal absorptive film layer 24 is shown being prepared with processes selected from the group consisting of oxidation and anodization to form an oxide layer over said temporary metal absorptive film layer. In addition, a nitridation process is used to form a nitride layer over said temporary metal absorptive film layer. These preparation processes are represented by the arrow identified with reference designator 28. These metal surface preparation processes are not unique to the present invention, and are well known in the art. The exact absorption coefficients are dependent on factors such as the wavelength of light, the material thickness, and the thickness of the oxide, or nitride layer formed.

Maa et al., in "Reflectivity reduction by oxygen plasma treatment of capped metallization layer", J. Vac. Sci. Technol., B 7 (2), Mar./Apr. 1989, pp. 145–149, disclose the reflectivity of oxidized metals, and this article is incorporated by reference into the present patent. For example, oxygen plasma was used in a tunnel reactor similar to that used for stripping photoresist to treat a variety of metals including Ti, Ta W, and Ti—W alloys. After a 30 minute treatment at temperatures up to 200° C., an oxygen pressure of 1 Torr, and power of 500 W, measurement were made of the reflectivity of the oxidized metals at wavelengths up to 800 nm.

Figure 5:
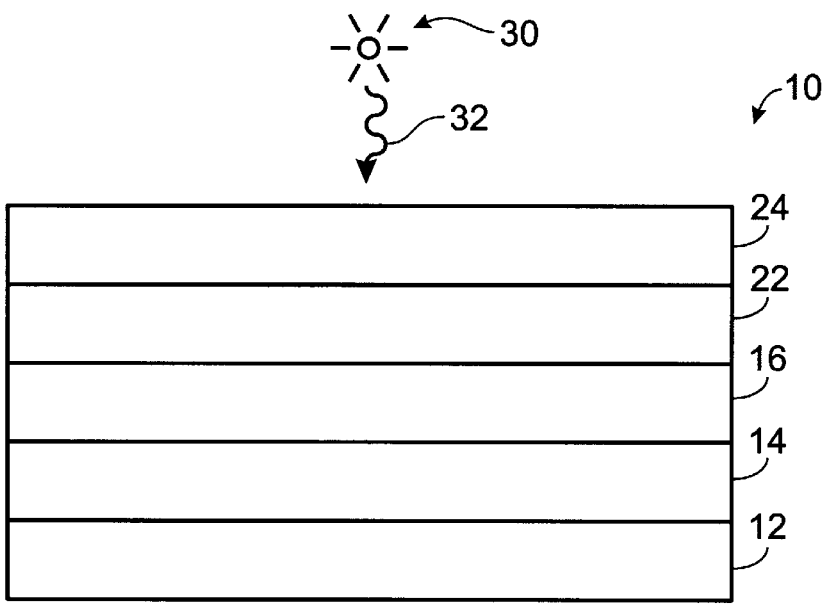
Figure 6:
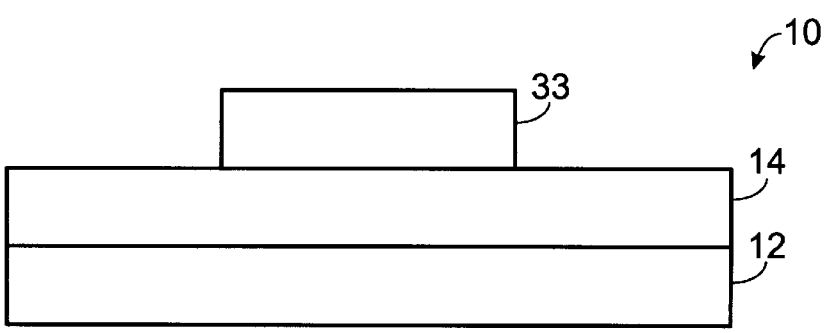

FIG. 5 depicts the rapid thermal annealing process of thin-film structure 10. Structure 10, and specifically amorphous silicon film 16, are annealed at a temperature in the range between 600 and 800° C. for a period of time in the range between 1 second and 5 minutes. The energy for the annealing process is supplied from a radiating light source identified with reference designator 30. RTA radiation source 30 is selected from the group consisting of tungsten-halogen and Xe arc lamps.

In the preferred embodiment, amorphous silicon film layer 16 is rapid thermally annealed with radiation, identified with reference designator 32, having a wavelength in the range between 200 nm and 1 $\mu$. When temporary metal absorptive film 24 is prepared to increase the absorption of light 32, as described above and shown in FIG. 4, over 50% of energy radiated 32, in the band between 200 nm ad 1 $\mu$, on temporary metal absorptive film layer 24 prepared surface, is absorbed by metal absorptive film 24. That is, almost no radiated energy, in the above-specified band, is lost due to transmission, and less than 50% is lost due to reflection. It should be noted that not all of the energy absorbed by metal film 24 is conducted to silicon film 16. A portion of the absorbed energy, or heat is lost due to radiation and convection losses through metal film 24 into the gas environment surrounding structure 10, and through radiation, convection, and conduction losses of structure 10 into the support mechanism (not shown).

FIG. 6 depicts a polycrystalline silicon film 33 formed by rapid thermal annealing amorphous silicon film 16 (see FIGS. 1–5). Metal absorptive film layer 24 (not shown) temporarily overlying amorphous silicon film 16 has been removed. That is, polycrystalline film 33 is shown after etching to remove temporary metal absorptive film 24 and oxide layer 22. Temporary metal absorptive film layer 24 was deposited to absorb and conduct radiated energy 32 to amorphous silicon film 16, controlling the crystallization process. Temporary metal absorptive film 24 is removed in this process step, subsequent to the RTA. In this manner, a thin layer of amorphous silicon 16 is heated sufficiently to rapid thermal anneal amorphous silicon film 16 with heat lamp 30.

Because of the dissimilarities between polycrystalline film 33 and metal absorption layer 24, metal absorption layer 24 is simple to remove. A selective etch strips away metal absorptive film 24 without affecting the underlying silicon 33. The etching of metal film 24 is accomplished, typically, with a wet etch, such as a piranha etch. Wet etching is a relatively minor process step in the fabrication of ICs. Portions of polycrystalline film 33 are shown removed through patterning as described in FIG. 1, or as described in FIG. 7, below. When amorphous silicon layer 16 has been patterned as shown in FIG. 1, some areas of oxide layer 22 overlie oxide layer 14. Typically, oxide layer 14 is substantially thicker than oxide third thickness 23. For, example, oxide layer 14 is 3000 Å while third thickness 23 is 500 Å. Then, it is relatively easy to remove thin layer oxide 22 without substantially effecting oxide layer 14, despite the inability to selectively etch.

Figure 7:
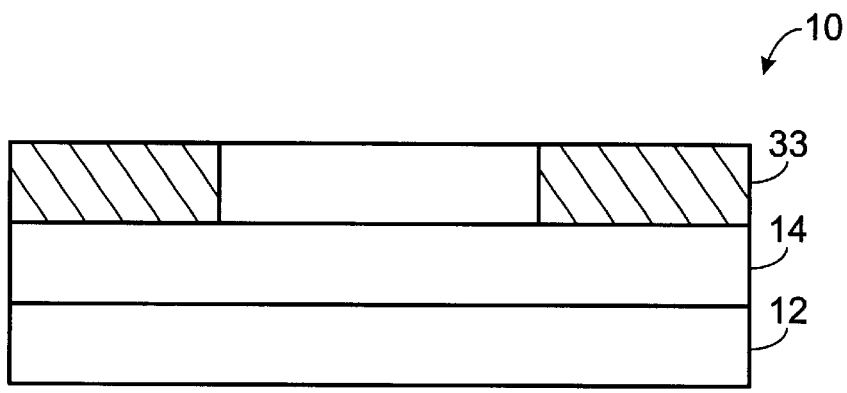

FIG. 7 depicts an alternate silicon patterning process to the one presented in FIG. 1. One advantage of this method is the avoidance of oxide layer 22 directly overlying oxide layer 14 to complicate the etching process. In this method, silicon film 16 is not patterned before the deposition of oxide layer 22. Temporary metal absorptive layer 24 and oxide barrier layer 22 are removed following the RTA process depicted in FIG. 5. Polycrystalline silicon film 33, the product of amorphous silicon film 16 after annealing, is patterned in process steps well known to those skilled in the art, subsequent to the removal of the temporary metal absorptive layer. The areas removed by patterned are depicted with cross-hatched lines. In this manner, the subsequently formed transistor active regions are isolated after the RTA annealing process, as opposed to before annealing as shown in FIG. 1.

Figure 8:
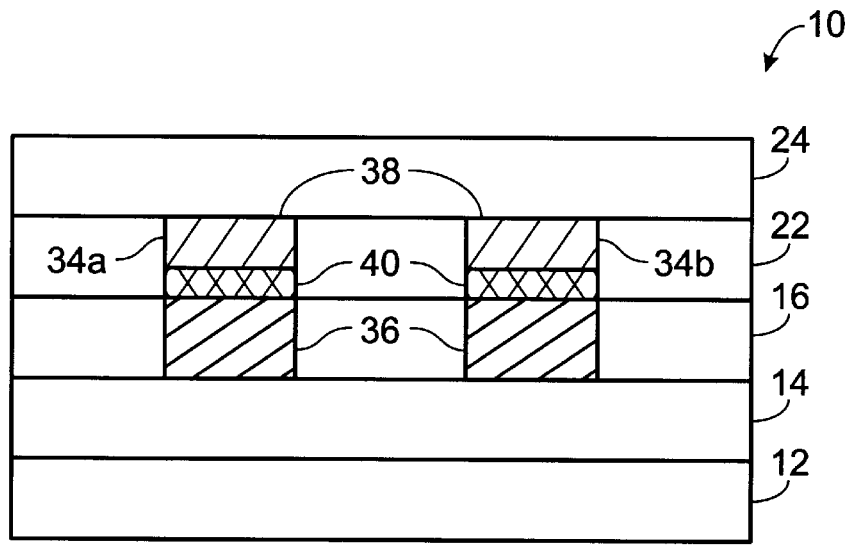
Figure 9:
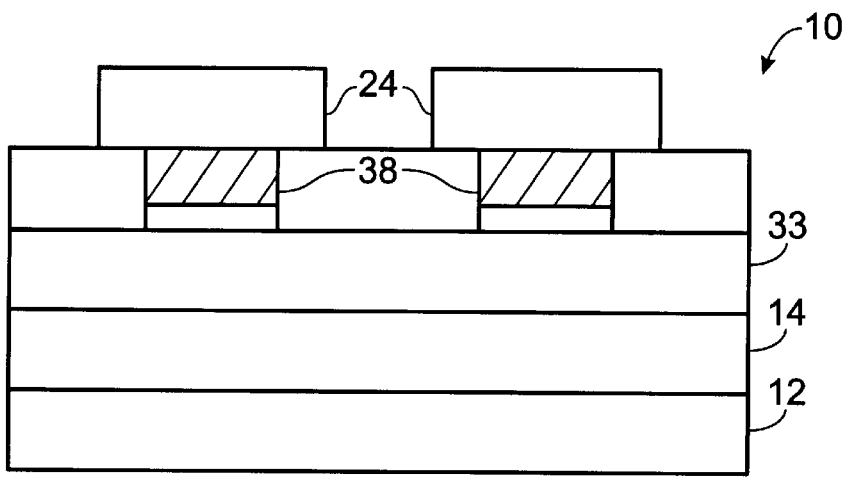

FIG. 8 depicts a variation of thin-film structure 10 in which contact holes 34a and 34b are patterned in oxide film layer 22 to access selected areas 36 of amorphous silicon film layer 16. A permanent metal absorptive film 38 is deposited in contact holes 34a and 34b. Permanent metal absorptive film 38 is not removed in subsequent processing steps, as is temporary metal absorptive film 24. For clarity, permanent metal film 38 is shown in FIG. 6 with cross-hatched lines, while temporary metal film 24 has none. However, both metal films 24 and 38 are deposited in the same process step and there is no fixed line of demarcation to differentiate metal films 24 and 38. In fact, portions of temporary metal film 24 may remain, after subsequent etching steps, to form lines, trenches, and interconnection structures to other areas of structure 10, as shown in Fig. 9 and described below. Both metal absorptive films 24 and 38 absorb radiated energy 32 and to conduct heat during the RTA process (see FIG. 5), however, permanent metal film 38 also forms electrical interconnections to overlying metal layers (not shown) formed in subsequent TFT processes. The use of metal filled vias to make interconnections is well known to those skilled in the art. However, the use of metal filled vias additionally serving to conduct heat to amorphous silicon layer 16, aiding the RTA process, is a unique feature of the present invention.

In some aspects of the invention, a conductive barrier material 40, shown with double cross-hatched lines, is deposited overlying said selected areas 36 of amorphous silicon film 16 accessed by contact holes 34a and 34b. Barrier layer 40 prevents permanent metal absorptive film 38 from interacting with amorphous silicon film accessed areas 36. That is, barrier material 40 prevents amorphous silicon film 16 from forming silicide during the RTA process. The desirability of silicide is dependent of the function of the TFT ultimately formed by the process of the present invention, and by the relative size of contact holes 34a and 34b to amorphous film layer 16. When contact holes are relatively small the silicon in selected areas 36 is completely consumed without degrading the performance of the subsequently formed TFT. Further, when silicon layer 16 is very thin with an underlying insulator such as oxide 14, or glass 12, a contact region between the silicide and a doped silicon region of film 16 is formed without concern for an underlying bulk region of silicon not present in TFTs.

FIG. 9 depicts thin-film structure 10 of FIG. 8, after the RTA process, so that amorphous silicon film 16 has been converted to polysilicon film 33. Portions of temporary metal absorptive film 24 have been removed to form isolated interconnection lines to other areas of the substrate (not shown). One method of patterning metal film 24 is to overlie a patterned photoresist profile (not shown) on metal film 24, and etching metal film 24 with the photoresist mask. Metal film 24 is also connected to permanent metal absorptive metal film 38, which has formed vias to polysilicon film 33. Polysilicon film 33, having been patterned, doped and annealed in previous process steps, is suitable for transistor active regions such as drains, sources, and channel regions.

Figure 10:
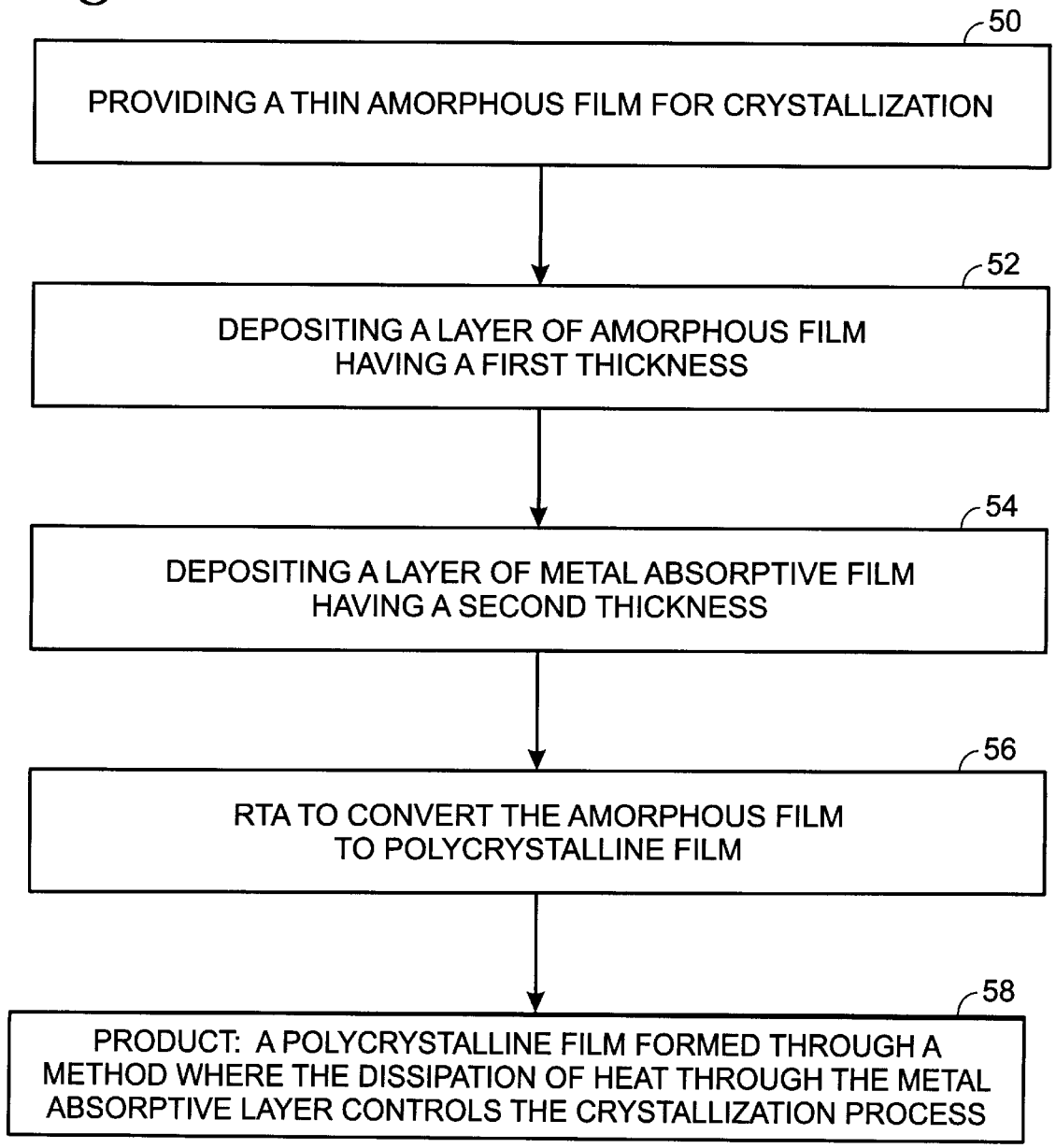
FIG. 10 is a flow chart illustrating steps in a method for crystallizing a thin amorphous film with the use of a metal absorptive film layer.

FIG. 10 is a flow chart illustrating steps in a method for crystallizing a thin amorphous film with the use of a metal absorptive film layer. Step 50 provides a thin amorphous film. The amorphous film is selected from the group consisting of silicon, germanium, and silicon-germanium alloys. However, silicon is used in the preferred embodiment of the invention.

Step 52 deposits a layer of amorphous film having a first thickness. When the amorphous film is silicon, Step 52 includes depositing an amorphous silicon film layer having a first thickness in the range between 300 and 1000 Å. Step 54 deposits a layer of metal absorptive film, having a second thickness, overlying the amorphous film layer, to absorb and conduct radiated energy. The metal absorptive film is selected from the group consisting of Ti, Ta, W, TiN, Mo, Nb, V, and Ti—W. When the amorphous film is silicon, Step 54 includes depositing a second thickness of metal absorptive film in the range between 250 and 5000 Å.

Step 56 rapid thermal anneals (RTA) to convert the amorphous film layer deposited in Step 52 into a polycrystalline film layer. Step 56 includes rapid thermal annealing at a temperature in the range between 600 and 800° C. for a period of time between 1 second and 5 minutes. The step also includes using a source of radiation selected from the group consisting of a tungsten-halogen lamp and a Xe arc lamps. Step 58 is a product, a polycrystalline film formed through a method where the dissipating of heat through the metal absorption layer controls the crystallization process.

Some aspects of the invention include further steps, following Step 52, and before Step 54. Step 52a (not shown) dopes the amorphous film layer, and Step 52b (not shown) anneals the doped amorphous film layer to electrically activate the dopant deposited in Step 52a. Alternately, only one new step is added. Then, Step 52a dopes the amorphous film layer, as above, but Step 56 now includes annealing the doped amorphous film layer to electrically activate the dopant deposited in Step 52a.

In some aspects of the invention a further step, following Step 52, and before Step 54, is included. Step 52c (not shown) deposits a layer of oxide film having a third thickness overlying the amorphous film layer to act as a barrier between the amorphous film and the subsequently deposited metal absorptive film. In this manner, the amorphous film does not react with the metal absorptive film during the RTA in Step 56. Step 52c includes depositing a layer of oxide film having a third thickness in the range between 200 and 2000 Å.

Some aspects of the invention include a further step, following Step 54, and before Step 56. Step 54a (not shown) prepares the surface of the metal absorptive film layer to be highly absorptive of radiated energy. In this manner, the prepared surface of the metal absorptive film layer absorbs additional radiated energy to speed the RTA process in Step 56. Step 54a includes preparing the surface of the metal absorptive film layer with processes selected from the group consisting oxidation and anodization to form an oxide layer over the metal film, and nitridation to form a nitride layer over the metal film.

Typically, Step 56 includes radiating the prepared surface of the metal absorptive film layer with light having a wavelength in the range between 200 nanometers (nm) and 1 micron ($\mu$). When the metal surface is prepared in accordance with Step 54a, over approximately 50% of the energy radiated on the surface of the prepared metal absorptive film layer is absorbed by the metal film layer, when light in this band of wavelengths is used.

Some aspects of the invention include the further steps, following Step 56, of Steps 56a and 56b (not shown). Step 56a etches to remove the metal absorption film layer. Typically, the oxide layer deposited in Step 52c is also etched away in this step. In this manner, the crystallized film layer is prepared for overlying material depositions. Step 56b, following Step 56a, patterns the crystallized film layer to form isolated regions of crystallized film. In this manner, the film is prepared for the fabrication of semiconductor active regions. Alternately, a Step 52d (not shown), following Step 52, and preceding Step 54, patterns the crystallized film to form isolated regions of amorphous film prior to crystallization in Step 56.

FIG. 11 is a flow chart illustrating steps in a method for crystallizing a thin layer of amorphous silicon film in the fabrication of a thin film transistor on a transparent substrate. Step 60 provides an amorphous silicon film in the fabrication of a TFT on a transparent substrate. Step 62 deposits a layer of the amorphous silicon film, having a first thickness, overlying the transparent substrate. The amorphous silicon film first thickness is in the range between 300 and 1000 Å.

Step 64 patterns the amorphous silicon film layer to form isolated regions. Step 66 dopes the amorphous silicon film. Step 68 deposits a layer of oxide film, having a third thickness, overlying the doped amorphous silicon film. The step includes the oxide film third thickness being in the range between 200 and 2000 Å. Step 70 deposits a layer of metal absorptive film, having a second thickness, to absorb radiated energy. The metal absorptive film second thickness is in the range between 250 and 5000 Å. The metal absorptive film is selected from the group consisting of Ti, Ta, W, TiN, Mo, Nb, V, and Ti—W.

Step 72 rapid thermal anneals (RTA) the transistor to convert the amorphous silicon film into a polycrystalline film. Step 72 includes rapid thermal annealing at a temperature in the range between 600 and 800° C. for a period of time in the range between 1 second and 5 minutes. A radiation source for the rapid thermal annealing selected from the group consisting of a tungsten-halogen lamp and a Xe arc lamp. Step 74 is a product, a polycrystalline film formed through a method where the dissipation of energy by metal absorptive film layer controls the crystallization process.

Some aspects of the invention include a further step, following Step 66 and preceding Step 68. Step 66a (not shown) anneals the doped amorphous silicon film to electrically activate the dopant deposited in Step 66. Alternately, Step 72 includes rapid thermal annealing the doped amorphous silicon film to activate the dopant deposited in Step 66.

In one aspect of the invention, a further step is included following Step 70, and preceding Step 72. Step 70a prepares the surface of the metal absorptive film layer to be highly absorptive of radiated energy across a broad spectrum of wavelengths. In this manner, addition radiation energy is absorbed by the metal absorptive film to speed the RTA process in Step 72. Step 70a includes preparing the surface of the metal absorptive film layer with processes selected from the group consisting of oxidation and anodization to form an oxide layer over the metal absorptive film, and nitridation to from a nitride layer over the metal absorptive film.

Typically, Step 72 includes radiating the prepared surface of the metal absorptive film layer with light having a wavelength in the range between 200 nm and 1 $\mu$. When the metal surface is prepared as described in Step 70a above, over 50% of energy radiated on the surface of the prepared metal absorptive film layer, in the band between 200 nm and 1 $\mu$, is absorbed by the metal absorptive film layer.

Some aspects of the invention include the further step, following Step 68, and preceding Step 70, of Step 68a (not shown). Step 68a patterns contact holes through the oxide film layer deposited in Step 68 to access selected areas of the amorphous silicon film deposited in Step 62. When Step 68a is included, Step 70 includes forming electrical interconnections from the silicon film, to subsequently formed overlying metal levels, through the metal absorptive film deposited in the contact holes. Then, Step 72 includes annealing the amorphous silicon with the conduction of heat through the metal absorptive film in the contact holes formed in Step 68a. In this manner, the metal absorptive film is left in the contact holes to form electrical interconnections and to speed the silicon film crystallized in Step 72. Some aspects of the invention include the further step, following Step 68a, and preceding Step 70, of Step 68b (not shown). Step 68b deposits a conductive barrier material in the contact holes patterned in Step 68a, to protect the selected areas of amorphous silicon film accessed in Step 68a from direct contact with the metal absorptive film layer deposited in the contact holes. In this manner, the selected areas of amorphous silicon film are not converted to silicide in the annealing process of Step 72.

Some aspects of the invention including the further step, following Step 72, of Step 72a. Step 72a etches to remove the metal absorptive film layer deposited in Step 70, and the oxide film layer deposited in Step 68. In some aspects of the invention, such as when the silicon layer is patterned before RTA, as discussed in the description of FIG. 6 above, a thin layer of oxide is deposited in Step 68 so as to be easily removed from the oxide between the transparent substrate and the silicon layer. In another aspect of the invention, the oxide layer deposited in Step 68 is not removed to avoid the problem of trying to differentiate overlying oxide layers. In this manner, the transistor in prepared for subsequent depositions of material in the process of fabricating a TFT.

The present invention offers a unique solution to the problem of rapid thermal annealing thin silicon film on a transparent substrate. The present method permits the silicon to be heated through the use of an radiation absorbent material that is highly etch selective to the silicon for easy removal after annealing. The use of absorbent metal films also permits convention RTA equipment and processes to be used, as special wavelengths of light are unnecessary to heat the silicon. Further, the conductant properties of the metal films allow greater control over the amount of heat that can be delivered to the silicon so that polysilicon with high electron mobilities can be cheaply fabricated. Variations in the structures presented above, and the method of using a metal film as an absorptive layer in the RTA process will occur to those skilled in the art.

What is claimed is:

1. A method for crystallizing a thin amorphous film comprising the steps of:
   a) depositing a layer of amorphous film having a first thickness;
   b) depositing a layer of metal absorptive film, having a second thickness, overlying the amorphous film layer, to absorb and conduct radiated energy; and
   c) rapid thermal annealing (RTA) to convert the amorphous film layer deposited in Step a) into a polycrystalline film layer, whereby the dissipation of heat through the metal absorptive film layer controls the crystallization process.

2. A method as in claim 1 in which the amorphous film is selected from the group consisting of silicon, germanium, and silicon-germanium alloys.

3. A method as in claim 2 in which the metal absorptive film is selected from the group consisting of Ti, Ta, W, TiN, Mo, Nb, V, and Ti—W.

4. A method as in claim 3 wherein the amorphous film is silicon, and in which Step b) includes depositing a second thickness of metal absorptive film in the range between 250 and 5000 Å.

5. A method as in claim 4 in which Step a) includes depositing an amorphous silicon film layer having a first thickness in the range between 300 and 1000 Å.

6. A method as in claim 5 in which Step c) includes rapid thermal annealing at a temperature in the range between 600 and 800° C. for a period of time between 1 second and 5 minutes.

7. A method as in claim 1 including the further steps, following Step a), and before Step b), of:
   $a_1$) doping the amorphous film layer; and
   $a_2$) annealing the doped amorphous film layer to electrically activate the dopant deposited in Step $a_1$).

8. A method as in claim 1 including the further step, following Step a), of:
   $a_1$) doping the amorphous film layer; and
   in which Step c) includes annealing the doped amorphous film layer to electrically activate the dopant deposited in Step $a_1$).

9. A method as in claim 1 including a further step, following Step a), and before Step b), of:
   $a_3$) depositing a layer of oxide film, having a third thickness, overlying the amorphous film layer to act as a barrier between the amorphous film and the subsequently deposited metal absorptive film, whereby the amorphous film does not react with the metal absorptive film during the RTA in Step c).

10. A method as in claim 9 in which Step $a_3$) includes depositing a layer of oxide film having a third thickness in the range between 200 and 2000 Å.

11. A method as in claim 1 including a further step, following Step b), and before Step c), of:
   $b_1$) preparing the surface of the metal absorptive film layer to be highly absorptive of radiated energy, whereby the prepared surface of the metal absorptive film layer absorbs additional radiated energy to speed the RTA process in Step c).

12. A method as in claim 11 in which Step $b_1$, includes preparing the surface of the metal absorptive film layer with processes selected from the group consisting oxidation and anodization to form an oxide layer over the metal film, and nitridation to form a nitride layer over the metal film.

13. A method as in claim 11 in which Step c) includes radiating the prepared surface of the metal absorptive film layer with light having a wavelength in the range between 200 nanometers (nm) and 1 micron ($\mu$), and in which over approximately 50% of the energy radiated on the surface of the prepared metal absorptive film layer, in the band between 200 nm and 1 $\mu$, is absorbed by the metal absorptive film.

14. A method as in claim 1 in which Step c) includes using a source of radiation selected from the group consisting of a tungsten-halogen lamp and a Xe arc lamps.

15. A method as in claim 1 including the further step, following Step c), of:
   d) etching to remove the metal absorption film layer, whereby the crystallized film layer is prepared for overlying material depositions.

16. A method as in claim 15 including the further step, following Step d), of:
   e) patterning the crystallized film layer to form isolated regions of crystallized film, whereby the film is prepared for the fabrication of semiconductor active regions.

17. A method as in claim 1 including the further step, following Step a), and preceding Step b), of:

$a_4$) patterning the crystallized film to form isolated regions of amorphous film prior to crystallization in Step c).

18. In fabricating a thin film transistor on a transparent substrate, a method of crystallizing a thin layer of amorphous silicon film comprising the steps of:

a) depositing a layer of the amorphous silicon film, having a first thickness, overlying the transparent substrate;

b) patterning the amorphous silicon film layer to form isolated regions;

c) doping the amorphous silicon film;

d) depositing a layer of oxide film, having a third thickness, overlying the doped amorphous silicon film;

e) depositing a layer of metal absorptive film, having a second thickness, to absorb radiated energy; and rapid thermal annealing (RTA) the transistor to convert the amorphous silicon film into a polycrystalline film, whereby the dissipation of energy by metal absorptive film layer controls the crystallization process.

19. A method as in claim 18 in which Step a) includes the amorphous silicon film first thickness being in the range between 300 and 1000 Å.

20. A method as in claim 18 in which Step e) includes the metal absorptive film second thickness being in the range between 250 and 5000 Å.

21. A method as in claim 18 in which Step d) includes the oxide film third thickness being in the range between 200 and 2000 Å.

22. A method as in claim 18 in which Step e) includes depositing a layer of metal absorptive film selected from the group consisting of Ti, Ta, W, TiN, Mo, Nb, V, and Ti—W.

23. A method as in claim 18 in which Step f) includes rapid thermal annealing at a temperature in the range between 600 and 800° C. for a period of time in the range between 1 second and 5 minutes.

24. A method as in claim 18 in which Step f) includes using a radiation source for the rapid thermal annealing selected from the group consisting of a tungsten-halogen lamp and a Xe arc lamp.

25. A method as in claim 18 including a further step, following Step c) and preceding Step d), of:

$c_1$) annealing the doped amorphous silicon film to electrically activate the dopant.

26. A method as in claim 18 in which Step f) includes rapid thermal annealing the doped amorphous silicon film to activate the dopant deposited in Step c).

27. A method as in claim 18 including a further step, following Step e), and preceding Step f), of:

$e_1$) preparing the surface of the metal absorptive film layer to be highly absorptive of radiated energy across a broad spectrum of wavelengths, whereby addition radiation energy is absorbed by the metal absorptive film to speed the RTA process in Step f).

28. A method as in claim 27 in which Step $e_1$) includes preparing the surface of the metal absorptive film layer with processes selected from the group consisting of oxidation and anodization to form an oxide layer over the metal absorptive film, and nitridation to from a nitride layer over the metal absorptive film.

29. A method as in claim 27 in which Step f) includes radiating the prepared surface of the metal absorptive film layer with light having a wavelength in the range between 200 nm and 1 $\mu$, and in which over 50% of energy radiated on the surface of the prepared metal absorptive film layer, in the band between 200 nm and 1 $\mu$, is absorbed by the metal absorptive film.

30. A method as in claim 18 including the further step, following Step d), and preceding Step e), of:

$d_1$) patterning contact holes through the oxide film layer deposited in Step d) to access selected areas of the amorphous silicon film deposited in Step a);

in which Step e) includes forming electrical interconnections from the silicon film, to subsequently formed overlying metal levels, through the metal absorptive film deposited in the contact holes; and in which Step f) includes annealing the amorphous silicon with the conduction of heat through the metal absorptive film in the contact holes formed in Step $d_1$), whereby the metal absorptive film is left in the contact holes to form electrical interconnections and to speed the silicon film crystallized in Step f).

31. A method as in claim 30 including the further step, following Step $d_1$), and preceding Step e), of:

$d_2$) depositing a conductive barrier material in the contact holes patterned in Step $d_1$) to protect the selected areas of amorphous silicon film accessed in Step $d_1$) from direct contact with the metal absorptive film layer deposited in the contact holes, whereby the selected areas of amorphous silicon film are not converted to silicide in the annealing process of Step f).

32. A method as in claim 18 including the further step, following Step f), of:

g) etching to remove the metal absorptive film layer deposited in Step e), and the oxide film layer deposited in Step d), whereby the transistor in prepared for subsequent depositions of material in the process of fabricating a TFT.

* * * * *